US006943360B1

(12) United States Patent
Mankos

(10) Patent No.: US 6,943,360 B1
(45) Date of Patent: Sep. 13, 2005

(54) TWISTED-COMPENSATED LOW-ENERGY ELECTRON MICROSCOPE

(75) Inventor: Marian Mankos, Palo Alto, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/889,240

(22) Filed: Jul. 12, 2004

(51) Int. Cl.$^7$ ............................................. H01J 37/304
(52) U.S. Cl. .............................. 250/492.2; 250/492.3; 250/396 R; 250/396 ML; 250/397; 250/398
(58) Field of Search .................... 250/492.2, 492.3, 250/396 R, 396 ML, 397, 398

(56) References Cited

U.S. PATENT DOCUMENTS

| 5,311,026 A | * | 5/1994 | Saitou et al. ............ 250/492.2 |
| 5,319,207 A | | 6/1994 | Rose et al. |
| 5,663,568 A | * | 9/1997 | Waskiewicz ............ 250/492.2 |
| 6,610,980 B2 | | 8/2003 | Veneklasen et al. |

OTHER PUBLICATIONS

R.M TROMP " Low-energy electron microscopy", IBM J. RES. Develop., Jul. 2000, pp. 503-516, vol. 44, No. 4.
V. Kolarik, et al. "Close packed prism arrays for electron microscopy", Optik 87, No. 1 (1991), pp. 1-12.
H. Rose, et al. "Outline of a versatile corrected LEEM", Optik 92, No. 1 (1992), pp. 31-44.

* cited by examiner

*Primary Examiner*—Nikita Wells
(74) *Attorney, Agent, or Firm*—Okamoto & Benedicto LLP

(57) ABSTRACT

One embodiment disclosed relates to a LEEM-type apparatus for inspecting a substrate. An illumination system generates an incident beam, and an objective lens system focuses the incident beam onto the substrate. In this case, the objective lens system comprises a magnetic immersion lens causing circumferential velocities in the incident beam, and the illumination system includes another magnetic immersion lens causing circumferential velocities in the incident beam that compensate for the circumferential velocities caused by the magnetic immersion lens in the objective lens system. Advantageously, this enables improved performance of parallel imaging e-beam systems that use a magnetic immersion objective lens.

21 Claims, 4 Drawing Sheets

TWISTED-COMPENSATED LOW-ENERGY ELECTRON MICROSCOPE

BACKGROUND OF THE INVENTION

1. Field of the Invention

The present invention relates to apparatus and methods for inspection or review of semiconductor wafers and masks.

2. Description of the Background Art

An electron beam (e-beam) apparatus based on a low-energy electron microscope (LEEM) configuration utilizes electrons reflecting of the surface of a flat substrate. Electron optical imaging systems for a LEEM configuration is complicated when compared to conventional straight-axis electron beam systems. The complication arises because the electron beam passes twice through one or more electron lenses. A design including a plurality of lenses arranged along one straight axis is therefore not practically feasible, and a beam separator is needed to split the incoming and outgoing beams.

SUMMARY

One embodiment of the invention relates to a LEEM-type apparatus for inspecting a substrate. An illumination system generates an incident beam, and an objective lens system focuses the incident beam onto the substrate. In this case, the objective lens system comprises a magnetic immersion lens causing circumferential velocities in the incident beam, and the illumination system includes another magnetic immersion lens causing circumferential velocities in the incident beam that compensate for the circumferential velocities caused by the magnetic immersion lens in the objective lens system. Advantageously, the present invention may be applied to improve the performance of parallel imaging e-beam systems that use a magnetic immersion objective lens.

The above-described diagrams are not necessarily to scale and are intended be illustrative and not limiting to a particular implementation.

DETAILED DESCRIPTION

A problem in using a magnetic immersion objective lens in LEEM configurations is that, when the system is operated in mirror mode, the electrons approaching the specimen surface acquire a circumferential velocity component, or twist. The twisting of electron trajectories arises from the spiraling of the electrons in the relatively strong magnetic field (typically a few hundred Gauss) that immerses the substrate from the magnetic immersion objective lens. The twisting causes significant degradation of resolution, and the degradation gets progressively larger with increasing field size. Towards the outer portions of the field of view, the twisting effect typically increases, causing the electrons to reflect farther from the surface (and so progressively out-of-focus).

Figure 1:
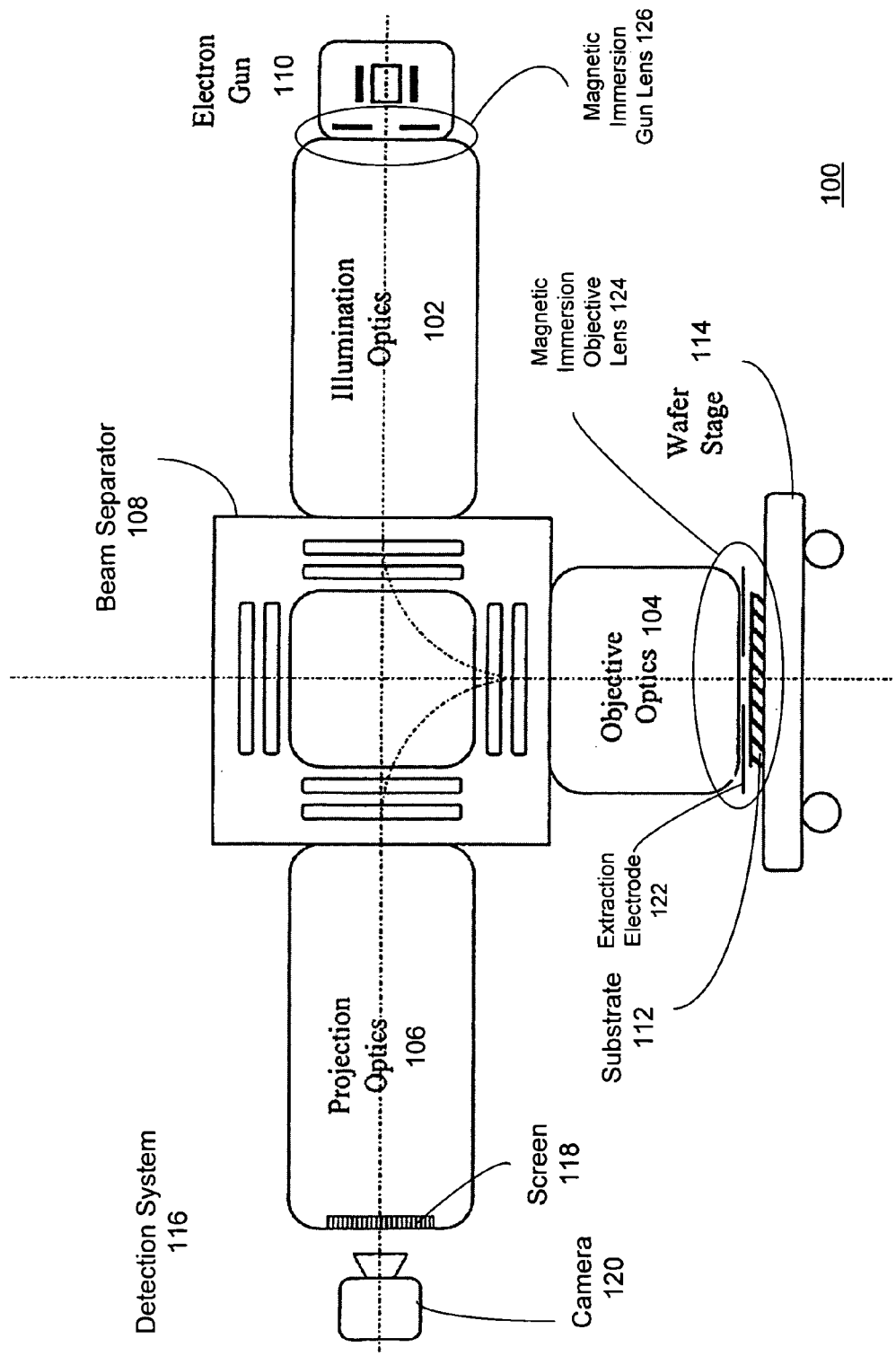
FIG. 1 is a schematic diagram depicting an apparatus for inspecting a substrate using charged particles in accordance with an embodiment of the invention.

Previous designs by Veneklasen et al., as well as most existing LEEMs, use an electron gun with electrostatic focusing as a source of illuminating electrons. However, applicant has determined a new LEEM-type configuration to correct for the twist effect caused by a magnetic immersion objective lens. An embodiment of the design is depicted in FIG. 1 and discussed below. In this embodiment, the illumination electron optics advantageously includes an electron gun with a cathode that is immersed in both electrostatic and magnetic fields.

FIG. 1 is a schematic diagram depicting an apparatus 100 for inspecting a substrate using charged particles in accordance with an embodiment of the invention. The apparatus 100 includes an illumination subsystem 102, an objective subsystem 104, a projection subsystem 106, and a beam separator 108. The beam separator 108 is coupled to and interconnects the illumination subsystem 102, the objective subsystem 104, and the projection subsystem 106.

The illumination subsystem (illumination optics) 102 is configured to receive and collimate charged particles from a charged-particle source. In a preferred embodiment, the charged particles comprise electrons, and the electron source comprises an "immersion" electron gun 110. A preferred embodiment of the electron source includes a magnetic immersion gun lens 126, as shown in FIG. 2.

Figure 2:
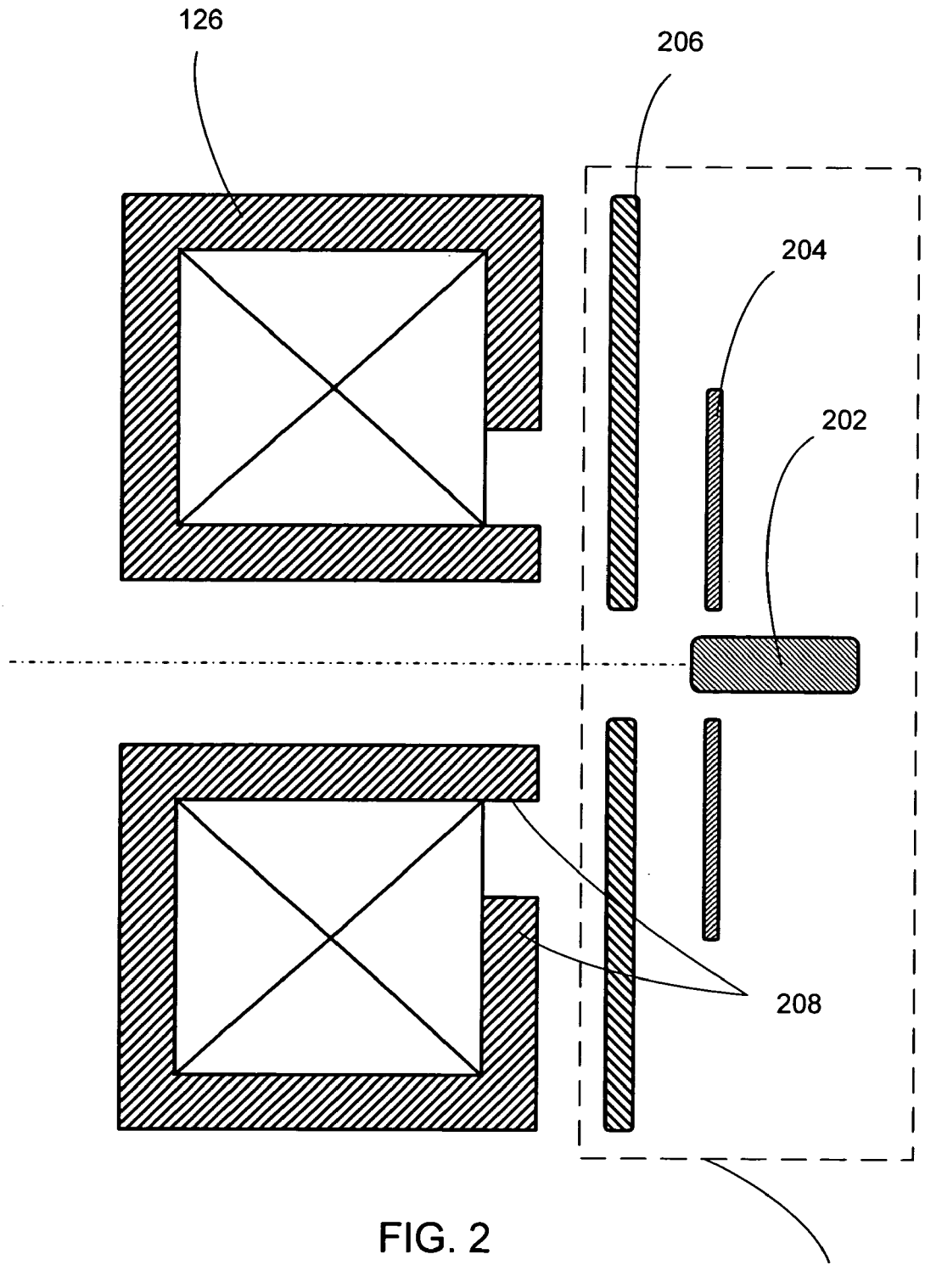
FIG. 2 shows an electron source with a magnetic immersion gun lens in accordance with an embodiment of the invention.

FIG. 2 is a cross-sectional diagram depicting an electron source in accordance with an embodiment of the invention. The electron source includes an electron gun 110 with a magnetic immersion gun lens 126 formed by pole pieces 208.

The electron gun 110 may comprise a cathode element 202, a bias (Wehnelt or suppressor) electrode 204, and an anode element 206. For purposes of explanation, consider the example where bias circuitry applies negative 50,000 volts to the cathode 202, applies negative 50,500 volts to the electrode 204, and electrically grounds the anode 206. Because the electrode 204 is at a negative potential relative to the cathode 202, electrons emitted from the cathode 202 are repelled by the electrode 202 so that a concentration of electrons is formed near the opening of the electrode 202. Since the anode 206 is at a much more positive relative potential, the electrons are accelerated to an energy of approximately 50,000 electron volts (eV) and have a trajectory along a line going through the opening of the anode 206. Of course, other specific voltages may be used depending on the specific implementation.

In accordance with an embodiment of the invention, the magnetic immersion gun lens 126 immerses the electrons with a magnetic field. The magnetic field is generated in the direction of the cathode 202 because the immersion lens 126 is configured with a radial gap between pole pieces 208 that faces towards the cathode region. Hence, the emitted electrons are immersed in both a magnetic field (from the magnetic immersion lens) and an electrostatic field (due to the potential difference between anode and cathode). The electrons emitted from this "immersion" electron gun are collimated by the illumination optics 102 to form the incident electron beam.

Due to the magnetic immersion gun lens 126, the incident electrons acquire a circumferential velocity component and so have a spiraling trajectory after leaving the gun. The magnitude of the circumferential velocity may be adjusted by adjusting the strength of the magnetic field generated by the magnetic immersion gun lens 126.

Returning to FIG. 1, the beam separator 108 is configured to receive the incident beam from the illumination subsystem 102 and to bend or deflect the incident beam by 90 degrees into the objective subsystem 104. In a preferred embodiment, the beam separator 108 comprises a magnetic prism array including a central magnetic section, an inner magnetic section outside the central section, and an outer magnetic section outside the inner section. The preferred embodiment of the beam separator 108 is described further below in relation to FIG. 4.

The objective subsystem (objective optics) 104 is configured to receive the incident beam from the beam separator 108 and to decelerate and focus the incident beam onto the substrate 112. The incident beam onto the substrate 108 causes reflection and/or emission of a scattered beam of charged particles. The scattered beam comprises a two-dimensional image of the illuminated area of the substrate 112. The objective optics 104 is further configured to re-accelerate the scattered beam and to refocus the two-dimensional image of the substrate area. In accordance with a preferred embodiment, the objective optics 104 includes a magnetic immersion objective lens 124 and extraction electrode 126, as shown in FIG. 3.

Figure 3:
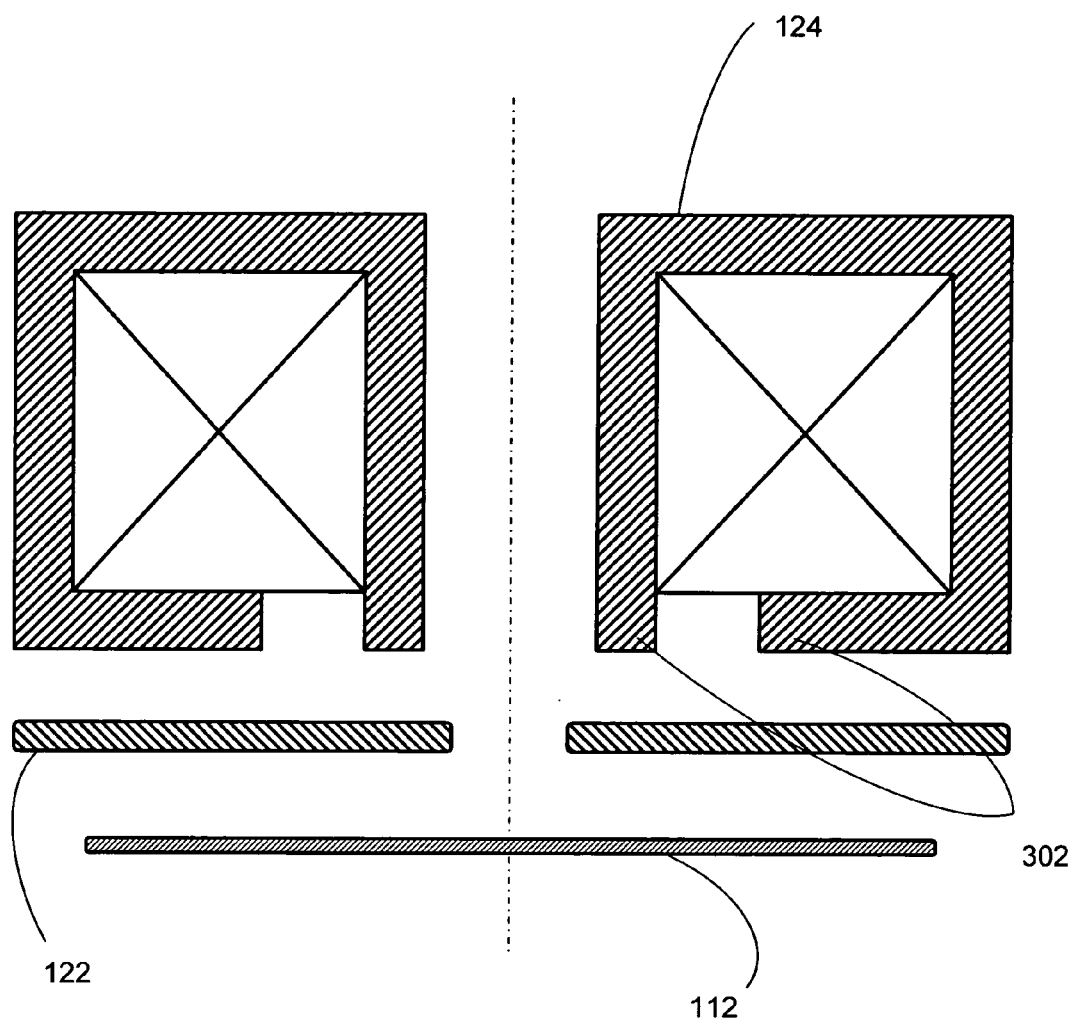
FIG. 3 shows a magnetic immersion objective lens in accordance with an embodiment of the invention.

FIG. 3 is a cross-sectional diagram showing the magnetic immersion objective lens 124 in accordance with an embodiment of the invention. The magnetic immersion objective lens 124 is positioned above the specimen 112 and is configured with pole pieces 302 such that the radial gap therebetween faces the surface of the specimen 112. With this configuration, a magnetic field is projected from the pole piece gap and immerses the specimen surface.

When the incident electrons enter the combined magnetic and electrostatic field near the substrate surface, the magnetic field from the magnetic immersion objective lens 124 is used to counteract the circumferential velocities originating due to the magnetic immersion gun lens 126. By appropriately adjusting the strengths of the magnetic fields at the gun and at the objective lens so that they "match", the circumferential velocities may be cancelled or reduced. This advantageously results in improved spatial resolution across the field of view, without undue resolution deterioration with increasing field size. In other words, high resolution (less than 50 nanometers resolution) is allowed across the full field of view in accordance with an embodiment of the invention. This enables the use of large fields of view for high-resolution imaging, thus increasing the throughput of an inspection or review system.

Returning again to FIG. 1, the beam separator 108 is configured to receive the scattered beam from the objective optics 104 and to bend the scattered beam towards the projection subsystem 106. The projection subsystem (projection optics) 106 is configured to receive the scattered beam from the beam separator 108 and to magnify and project the scattered beam onto a detector 116. In this way, a magnified two-dimensional image of the illuminated substrate area is obtained. In one embodiment, the detector 116 may comprise a phosphorescent screen 118 and a camera 120 as depicted. In another embodiment, the detector 116 may include a charge-coupled device (CCD) array.

Figure 4:
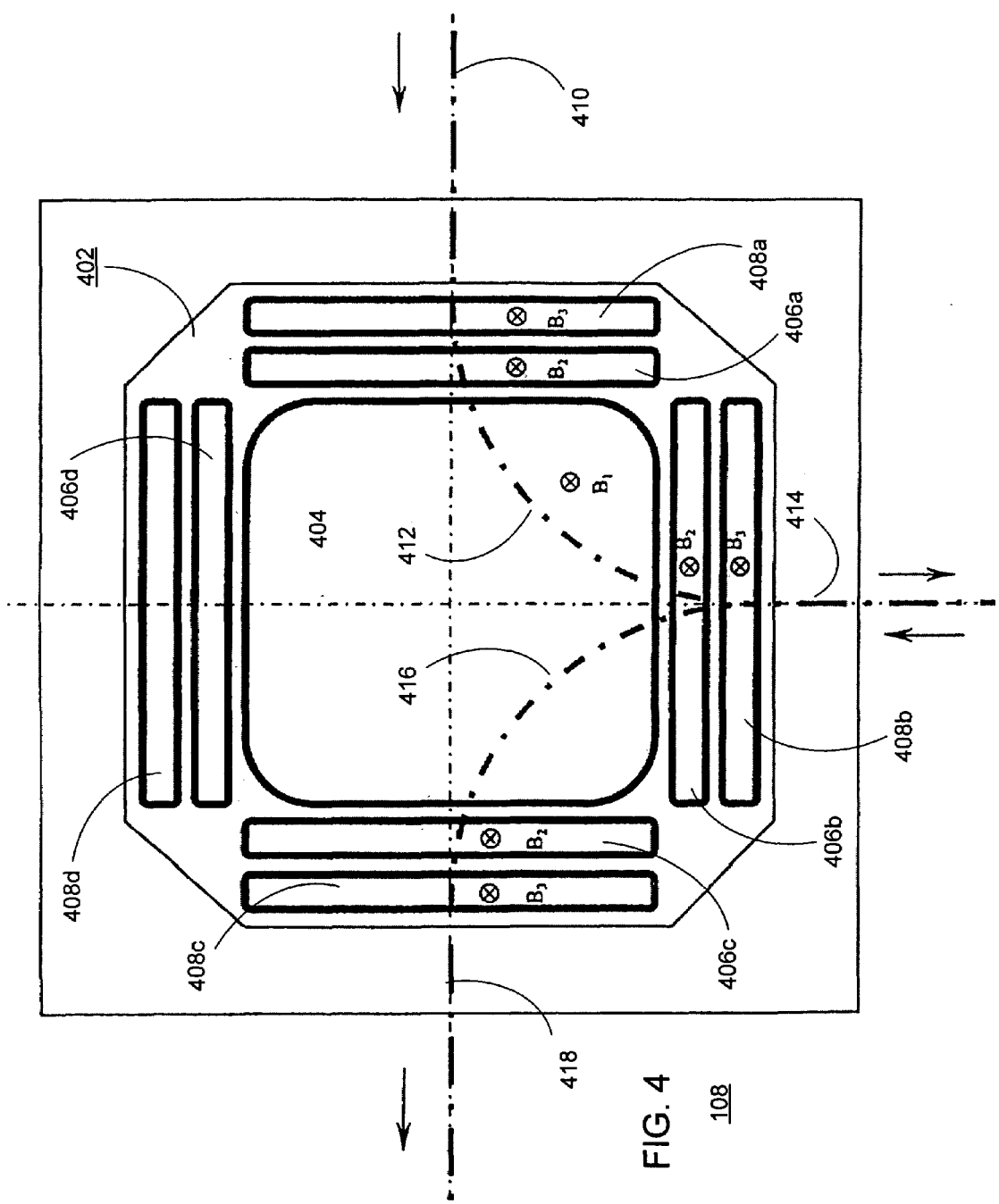
FIG. 4 is a schematic diagram depicting the beam separator in accordance with an embodiment of the invention.

FIG. 4 is a schematic diagram depicting the beam separator 108 in further detail in accordance with an embodiment of the invention. The beam separator 108 may comprise a magnetic prism array 402 that is configured advantageously as disclosed in U.S. patent application Ser. No. 10/775,646, by Marian Mankos, entitled "Prism Array for Electron Beam Inspection and Defect Review." The disclosure of aforementioned U.S. patent application Ser. No. 10/775,646 is hereby incorporated by reference. The array 402 comprises a central sector 404, an inner section 406 configured outside of and around the central sector 404, and an outer section 406 configured outside of and around the inner section 406. In the embodiment illustrated, the inner section 406 comprises multiple inner sectors (406a, 406b, 406c, and 406d), and the outer section 408 comprises multiple outer sectors (408a, 408b, 408c, and 408d). In particular, the central sector 404 is surrounded by an inner 406 an outer 408 sector along each axis (for a total of 9 sectors in this instance). Each of the sectors (including the central sector 404, the multiple inner sectors 406, and the multiple outer sectors 408) generates a substantially uniform magnetic field of a different strength and affects a different trajectory portion. As illustrated, during each 90-degree deflection, the pertinent charged particle beam passes through an outer sector, an inner sector, the central sector, another inner sector, and another outer sector. The lengths of the affected trajectory portion in the inner and outer sectors are significantly shorter than that in the central sector.

The incident charged-particle beam from the illumination optics 102 is received on an initial trajectory 410 as depicted in FIG. 4. When the incident beam enters the prism array 402, it traverses the magnetic field of strength $B_3$ produced by the first outer sector 408a which faces the illumination optics 102. Next, the incident beam traverses the magnetic field of strength $B_2$ produced by the first inner sector 406a. Next, the incident beam travels across the magnetic field of strength $B_1$ produced by the central sector 404. As the incident beam traverses these magnetic fields, a force proportional to the magnetic field strengths acts on the charged particles in a direction perpendicular to their trajectory (i.e. perpendicular to their velocity vectors). In particular, as the incident beam traverses the outer, inner, and central sectors, its trajectory 412 is bent towards the side of the magnetic prism array 402 that faces the objective optics 104. The incident beam exits the central sector 404 and enters the magnetic field of strength $B_2$ produced by the second inner sector 406b. After traversing the second inner sector 406b, the incident beam traverses the magnetic field of strength $B_3$ produced by the second outer sector 408b. The second inner and outer sectors further bend the trajectory of the incident beam. After passing through these two sectors, the incident beam is on a trajectory 414 heading into the objective optics 104.

The scattered beam exits the central sector 104 and enters the magnetic field of strength $B_3$ produced by the second outer sector 408b. After traversing the second outer sector 408b, the scattered beam traverses the magnetic field of strength $B_2$ produced by the second inner sector 406b. After passing through these two sectors, the scattered beam traverses the central sector 404. As the scattered beam traverses these magnetic fields, a force proportional to the magnetic field strengths acts on the charged particles in a direction perpendicular to their trajectory (i.e. perpendicular to their velocity vectors). In particular, as the scattered beam traverses the outer, inner, and central sectors, its trajectory 416 is bent towards the side of the magnetic prism array 402 that faces the projection optics 106. The scattered beam exits the central sector 404 and enters the magnetic field of strength $B_2$ produced by the third inner sector 406c. After traversing the third inner sector 406c, the scattered beam traverses the magnetic field of strength $B_3$ produced by the third outer sector 408c. The third inner and outer sectors further bend the trajectory of the scattered beam. After passing through these two sectors, the scattered beam is on a trajectory 418 heading into the projection optics 106. As described above in relation to FIG. 1, the projection optics 106 is configured to receive the scattered beam and to project the scattered beam onto a detection system 116. In this way, a magnified two-dimensional image of the area being inspected is obtained.

A preferred embodiment advantageously uses the double (both outer 408 and inner 406) sector layer surrounding the central sector 404. In contrast, the conventional magnetic prism array includes only a single sector layer surrounding the central sector. In accordance with the preferred embodiment, the magnetic field strength in each of the outer sectors 408 is a relatively high level of $B_3$. In contrast, the magnetic field strength in each of the inner sector 406 is a relatively low level of $B_2$. The magnetic field strength in the central sector 404 is at an intermediate level of $B_1$. These magnetic field strengths are determined by the chosen excitations of the coils (i.e. the electrical current run through the coils).

The excitations of the coils may be selected such that the prism array 402 acts as a thick round lens along the curved axes through it and bends the charged-particle beams by 90 degrees, where the trajectories illustrated in FIG. 4 are along the curved axes. As such, the prism 402 may be set to image stigmatically in both the image and diffraction planes while deflecting the charged-particle beams by 90 degrees. The stigmatic focusing and round lens behavior substantially simplifies the set-up, alignment and operation of the apparatus. Consider that the central sector 404 deflects a beam trajectory by an angle of $\phi_1$, each inner sector 406 deflects the beam by an angle of $\phi_2$, and each outer sector 408 deflects the beam by an angle of $\phi_3$. The angle $\phi_1$ is due to $B_1$, and the length of the path through the central sector 404. The angle $\phi_2$ is due to $B_2$ and the length of the path through an inner sector 406. The angle $\phi_3$ is due to $B_3$ and the length of the path through an outer sector 408. An advantageous aspect of the prism 402 relates to the following. For a given magnetic field strength $B_1$, there is a range of magnetic field strengths for $B_2$ and $B_3$ such that the total deflection angle $\phi_1 + 2\phi_2 + 2\phi_3$ equals 90 degrees. In other words, the ratio of $B_2/B_3$ is variable. For example, $B_3$ may be decreased and $B_2$ increased such that the 90 degree total deflection is maintained. Similarly, $B_3$ may be increased and $B_2$ decreased such that the 90 degree total deflection is maintained.

The feature of having two separate and independently-controllable coils generating flux densities $B_2$ and $B_3$ in each arm of the magnetic prism array 402 allows for the flexible variation in the effective lengths of the center and outer fields, while maintaining the stigmatic focusing characteristic. In a preferred embodiment, each of the inner 406 and outer 408 sectors independently controllable from each other (such that two inner sectors need not have the exact same magnetic field strengths, and two outer sectors also need not have the exact same magnetic field strengths). This enables the invented prism array 402 to be "tuned" to adjust for potential machining and/or calculation errors, such that a desired imaging condition and alignment is obtainable. In contrast, the conventional magnetic prism array with only one sector per arm cannot compensate for machining and/or calculation errors without adversely affecting the stigmatic focusing behavior of the prism or the alignment of the beam in the objective and/or projection optics. As a further advantage, the two independent prism sectors in each arm (quadrant) simplify the necessary design and machining of the prism sectors. Because of the flexibility provided by the two independent sectors, the sectors may be designed with straight edges and 90 degree angles, without any curved edges or cuts at arbitrary angles. While the above-described embodiment includes two magnetic sectors per arm or quadrant of the prism array, more than two sectors per arm may also be utilized to achieve the same effect.

As discussed above, a preferred embodiment of the present invention uses a cathode immersed in a magnetic field to compensate for the circumferential velocities acquired by electrons mirrored from a surface of a substrate that is also immersed in a magnetic field. This enables the improved performance of parallel imaging electron beam systems that use a magnetic immersion objective lens. One contemplated application of the present invention is in a system performing parallel imaging of semiconductor substrates and masks in a production environment. The present invention may also be advantageously applied in other applications.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for inspecting a substrate using charged particles, the apparatus comprising:
    an illumination system configured to generate an incident charged-particle beam;
    an objective lens system configured to receive the incident beam, to focus the incident beam onto the substrate, and to retrieve a scattered beam from the substrate;
    a projection system configured to receive the scattered beam and to project the scattered beam onto a detector; and
    a beam separator coupled to and interconnecting the illumination system, the objective lens system, and the projection system,
    wherein the beam separator is configured to receive the incident beam from the illumination system, bend the incident beam towards the objective lens system, receive the scattered beam from the objective lens system, and bend the scattered beam towards the projection system,
    wherein the objective lens system includes a magnetic immersion lens causing circumferential velocities in the incident beam, and
    wherein the illumination system includes another magnetic immersion lens causing circumferential velocities in the incident beam that compensate for the circumferential velocities caused by the magnetic immersion lens in the objective lens system.

2. The apparatus of claim 1, wherein the apparatus comprises a low-energy electron microscope (LEEM) operating in a mirror mode.

3. The apparatus of claim 1, wherein the magnetic immersion lens in the objective lens system comprises pole pieces with a gap facing the substrate.

4. The apparatus of claim 1, wherein the magnetic immersion lens of the illumination system comprises pole pieces with a gap facing an electron gun.

5. The apparatus of claim 1, whereby high-resolution imaging is performable across a field of view.

6. The apparatus of claim 5, wherein the high-resolution imaging comprises imaging at a resolution of less than 50 nanometers.

7. The apparatus of claim 1, wherein the beam separator comprises a magnetic prism having at least two independent prism sectors per arm.

8. The apparatus of claim 7, wherein the magnetic prism is "tuned" to maintain a stigmatic focusing characteristic.

9. The apparatus of claim 1, wherein the illumination system comprises an electron gun including at least a cathode and an anode, wherein electrons emitted from the cathode are accelerated through an opening in the anode, and wherein the electrons acquire said circumferential velocities due to passing through a magnetic field generated by the magnetic immersion lens in the illumination system.

10. The apparatus of claim 1, wherein electrical currents through the magnetic immersion lenses are adjustable to obtain minimal circumferential velocities in the incident beam as the incident beam is reflected from the substrate.

11. A method of inspecting a substrate using charged particles, the method comprising:
generating an incident charged-particle beam and causing twisting of particles in the incident beam;
bending the incident beam through a magnetic prism;
focusing the incident beam to a substrate and substantially reducing the twisting of the particles therein;
retrieving a reflected charged-particle beam;
bending the reflected beam through the magnetic prism; and
projecting the reflected beam to a detection system.

12. The method of claim 11, wherein the charged particles comprise electrons.

13. The method of claim 12, wherein the twisting of electrons in the incident beam is caused by a first magnetic field at an electron gun.

14. The method of claim 13, wherein the first magnetic field is generated by a first immersion lens.

15. The method of claim 14, wherein the substantial reduction of the twisting is caused by a second magnetic field at the substrate.

16. The method of claim 15, wherein the second magnetic field is generated by a second immersion lens.

17. The method of claim 11, wherein high-resolution imaging is performed across a field of view.

18. The method of claim 17, wherein the high-resolution imaging comprises imaging at a resolution of less than 50 nanometers.

19. The method of claim 11, wherein the magnetic prism includes at least two independent prism sectors per arm, and further comprising maintaining a stigmatic focusing characteristic by adjusting magnetic field strengths in the prism sectors.

20. A low-energy electron microscope inspection apparatus, the apparatus comprising:
means for generating an incident charged-particle beam and causing twisting of particles in the incident beam;
means for focusing the incident beam to a substrate and substantially reducing the twisting of the particles therein;
means for retrieving a reflected charged-particle beam; and
means for projecting the reflected beam to a detection system.

21. The apparatus of claim 20, further comprising: means for bending the incident beam through a ninety degree angle; and means for bending the reflected beam through a ninety degree angle.

* * * * *

UNITED STATES PATENT AND TRADEMARK OFFICE
CERTIFICATE OF CORRECTION

PATENT NO. : 6,943,360 B1
APPLICATION NO. : 10/889240
DATED : September 13, 2005
INVENTOR(S) : Mankos It is certified that error appears in the above-identified patent and that said Letters Patent is hereby corrected as shown below:

on front page, replace the Title with,

-- TWIST-COMPENSATED LOW-ENERGY ELECTRON MICROSCOPE--

Signed and Sealed this

Twenty-second Day of August, 2006

JON W. DUDAS
*Director of the United States Patent and Trademark Office*